(12) United States Patent
Hsiao et al.

(10) Patent No.: US 7,129,789 B2
(45) Date of Patent: Oct. 31, 2006

(54) FAST LOCKING METHOD AND APPARATUS FOR FREQUENCY SYNTHESIS

(75) Inventors: Chi-Ming Hsiao, Taichung (TW); Chang-Fu Kuo, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 139 days.

(21) Appl. No.: 11/027,966

(22) Filed: Jan. 3, 2005

(65) Prior Publication Data

US 2006/0145732 A1 Jul. 6, 2006

(51) Int. Cl.
*H03L 7/00* (2006.01)
(52) U.S. Cl. .................. 331/1 A; 331/25; 327/156; 327/159; 327/161; 375/376
(58) Field of Classification Search .............. 331/1 A, 331/25; 327/156, 159, 161; 375/376
See application file for complete search history.

(56) References Cited

U.S. PATENT DOCUMENTS 6,150,891 A 11/2000 Welland et al. ............. 331/25
6,236,696 B1 * 5/2001 Aoki et al. .................. 375/376
6,856,658 B1 * 2/2005 Baba et al. .................. 375/355

\* cited by examiner

*Primary Examiner*—Arnold Kinkead
(74) *Attorney, Agent, or Firm*—Thomas, Kayden, Horstemeyer & Risley

(57) ABSTRACT

A fast-locking apparatus and method for frequency synthesis. A transition detector receives a first pulse signal indicative that the phase of an input signal leads that of a reference signal, receives a second pulse signal indicative that the phase of the input signal lags that of the reference signal, and generates a state signal indicative of whether the first pulse signal is ahead of the second pulse signal. A pulse-width detector generates a first width signal indicative of into which range the width of the first pulse signal falls; another pulse-width detector generates a second width signal indicative of into which range the width of the second pulse signal falls. According to the state signal and the first and the second width signals, control logic generates a regulation signal for use in adjusting the frequency of the input signal.

20 Claims, 8 Drawing Sheets

FAST LOCKING METHOD AND APPARATUS FOR FREQUENCY SYNTHESIS

BACKGROUND

The invention relates to frequency synthesis, and more particularly to a fast-locking scheme for use in a frequency synthesizer.

The rapid growth of cellular communications systems has motivated an increasing demand for high performance integrated radio frequency (RF) components. One of the most important building blocks of these systems is the local oscillator (LO). In modern RF transceivers, the oscillators are usually embedded in a synthesizer environment so as to achieve a precise definition of the output frequency. Phase-locked loop (PLL) techniques have been widely used in frequency synthesis to meet the stringent requirements of wireless standards, because under locked condition the output frequency of a PLL bears an exact relationship with the input frequency.

A PLL-based synthesis technique offers high integration, low power dissipation, small chip area, high reliability, and predictable performance. There are a wide variety of frequency synthesizers disclosed in United States patents including U.S. Pat. No. 6,150,891 for example. It is known that the synthesizer requires a finite time to establish a new frequency when a communications system intends a change in the channel. The performance of communications systems is critically dependent on the lock time of frequency synthesizers. The lock time is an indication of how fast the new frequency is stabilized. This parameter is especially important in fast frequency-hopped systems.

SUMMARY

Systems and methods involving fast-locking are provided for frequency synthesis. In this regard, an embodiment of a fast-locking apparatus for frequency synthesis comprises a transition detector and two pulse-width detectors. The transition detector receives a first pulse signal indicative that the phase of an input signal leads the phase of a reference signal, and receives a second pulse signal indicative that the phase of the input signal lags the phase of the reference signal. A state signal is generated accordingly, in which the state signal indicates whether a significant transition of the first pulse signal leads a significant transition of the second pulse signal. In response to the first pulse signal, a pulse-width detector generates a first width signal indicative of into which of a plurality of first predefined width ranges the width of the first pulse signal falls. In response to the second pulse signal, another pulse-width detector generates a second width signal indicative of into which of a plurality of second predefined width ranges the width of the second pulse signal falls. Furthermore, the fast-locking apparatus also comprises control logic to generate a regulation signal for use in adjusting the frequency of the input signal according to the state signal and the first and the second width signals.

In another aspect, an embodiment of a frequency synthesizer comprises a phase-shifted signal generator, a phase delay circuit, and a phase discriminator. The phase-shifted signal generator produces a plurality of clock signals incrementally shifted in phase from a reference signal and selects a reference clock signal from the plurality of clock signals contingent upon the phase of an input signal. The phase delay circuit is configured to receive the input signal and the reference clock signal. The phase delay circuit is responsible for generation of a phase-delayed input signal on the basis of the input signal, in which the phase-delayed input signal has a phase tuned close to the phase of the reference clock signal. The phase discriminator comprises a transition detector and two pulse-width detectors. The transition detector receives a first pulse signal indicative that the phase of the phase-delayed input signal leads the phase of the reference clock signal, and receives a second pulse signal indicative that the phase of the phase-delayed input signal lags the phase of the reference clock signal. A state signal is generated accordingly, in which the state signal indicates whether a significant transition of the first pulse signal leads a significant transition of the second pulse signal. In response to the first pulse signal, a pulse-width detector generates a first width signal indicative of into which of a plurality of first predefined width ranges the width of the first pulse signal falls. In response to the second pulse signal, another pulse-width detector generates a second width signal indicative of into which of a plurality of second predefined width ranges the width of the second pulse signal falls. Furthermore, the phase discriminator also comprises control logic to generate a regulation signal used in adjusting the frequency of the input signal according to the state signal and the first and the second width signals.

In yet another aspect, an embodiment of a fast-locking method for frequency synthesis comprises the steps of receiving a first pulse signal indicative that the phase of a phase-delayed input signal leads the phase of a reference clock signal; receiving a second pulse signal indicative that the phase of the phase-delayed input signal lags the phase of the reference clock signal; generating a state signal indicative of whether a significant transition of the first pulse signal leads a significant transition of the second pulse signal; generating a first width signal indicative of into which of a plurality of first predefined width ranges the width of the first pulse signal falls; generating a second width signal indicative of into which of a plurality of second predefined width ranges the width of the second pulse signal falls; and generating a regulation signal used in adjusting the frequency of the phase-delayed input signal according to the state signal and the first and the second width signals.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

Reference throughout this specification to "one embodiment" or "an embodiment" indicates that a particular feature, structure, or characteristic described in connection with the embodiments is included in at least one embodiment of the present invention. Thus, the appearance of the phrases "in one embodiment" or "an embodiment" in various places throughout this specification is not necessarily all referring to the same embodiment. Furthermore, the particular features, structures, or characteristics may be combined in one or more embodiments. As to the accompanying drawings, it should be appreciated that not all components necessary for a complete implementation of a practical system may be illustrated or described in detail. In some embodiments, apparatus elements are provided for performing method steps. For example, an apparatus element may be provided for performing the functionality disclosed in a corresponding method step and may be referred to as a means for, an element for, or a unit for performing that method step.

Figure 1:
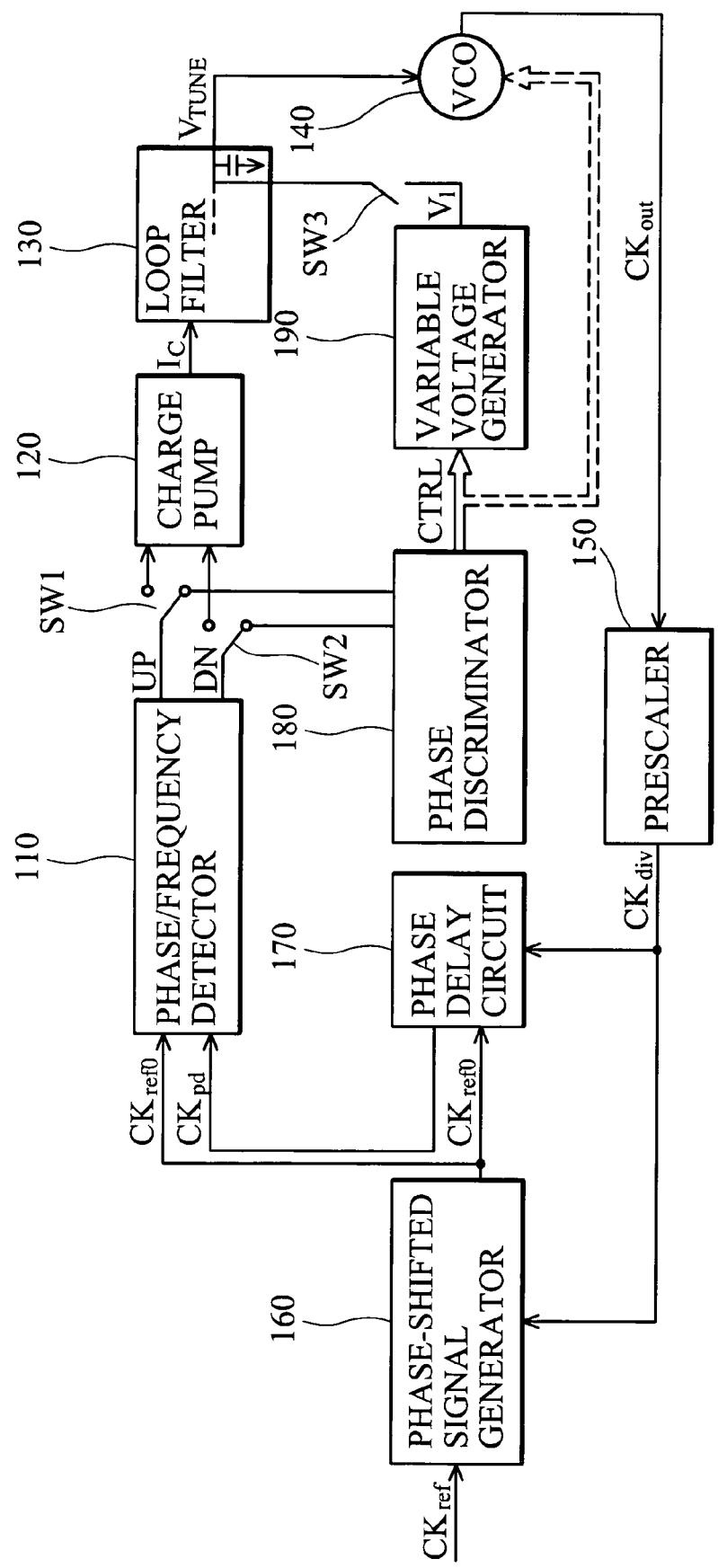
FIG. 1 is a block diagram illustrating an embodiment of a frequency synthesizer.

Referring to FIG. 1, an embodiment of a frequency synthesizer is illustrated and identified by the reference numeral 100. As depicted, an output signal $CK_{out}$ is received by a prescaler 150 where the frequency of the $CK_{out}$ signal is divided by N. The resulting signal $CK_{div}$ is applied to a phase-shifted signal generator 160 and a phase delay circuit 170. The phase-shifted signal generator 160 also receives a reference signal $CK_{ref}$, and outputs a phase-shifted reference signal $CK_{ref0}$ to the phase delay circuit 170 and a phase/frequency detector 110. The phase delay circuit 170 is responsible for generation of a phase-delayed version CK d from the $CK_{div}$ signal, in which the $CK_{pd}$ signal has a phase tuned close to the phase of the $CK_{ref0}$ signal. A phase/frequency detector 110 can detect both phase and frequency difference between the $CK_{pd}$ signal and the $CK_{ref0}$ signal, and thereby produces two control signals UP and DN. Typically, the UP and DN signals take the form of pulses having a width or duration corresponding to the phase difference. The phase/frequency detector 110 is selectively coupled to either a charge pump 120 or phase discriminator 180 via two switches SW1 and SW2. When the synthesizer 100 starts to establish a new frequency, the phase discriminator 180 is allowed to receive the UP and DN signals during a fast-locking mode. The phase discriminator 180 can generate a regulation signal CTRL to adjust the frequency of the $CK_{out}$ signal. The regulation signal CTRL is applied to a variable voltage generator 190, which is selectively coupled to a voltage-controlled oscillator (VCO) 140 through a loop filter 130 by a switch SW3. In this embodiment, the variable voltage generator 190 is capable of producing a plurality of voltage control signals so as to select one of them as output according to the CTRL signal. The magnitude of each voltage control signal is proportional to the output frequency of the VCO 140. Further, the magnitude of these voltage control signals need not be stepped by the same size. In the fast-locking mode, $V_1$, the output of the variable voltage generator 190 develops an initial voltage across the loop filter 130 for use as a tuning voltage $V_{TUNE}$, thus controlling the frequency of the $CK_{out}$ signal generated by the VCO 140. Some embodiments of the VCO 140 include a capacitor array (not shown) for discrete frequency tuning. Therefore, the CTRL signal may also be applied to the VCO 140 on the capacitor array to alter the frequency of the $CK_{out}$ signal. In normal operation, the UP and DN signals direct a charge pump 120 to either source or sink current $I_C$ to or from a loop filter 130 to adjust the voltage $V_{TUNE}$, thus finely tuning the output frequency of the VCO 140.

Figure 2:
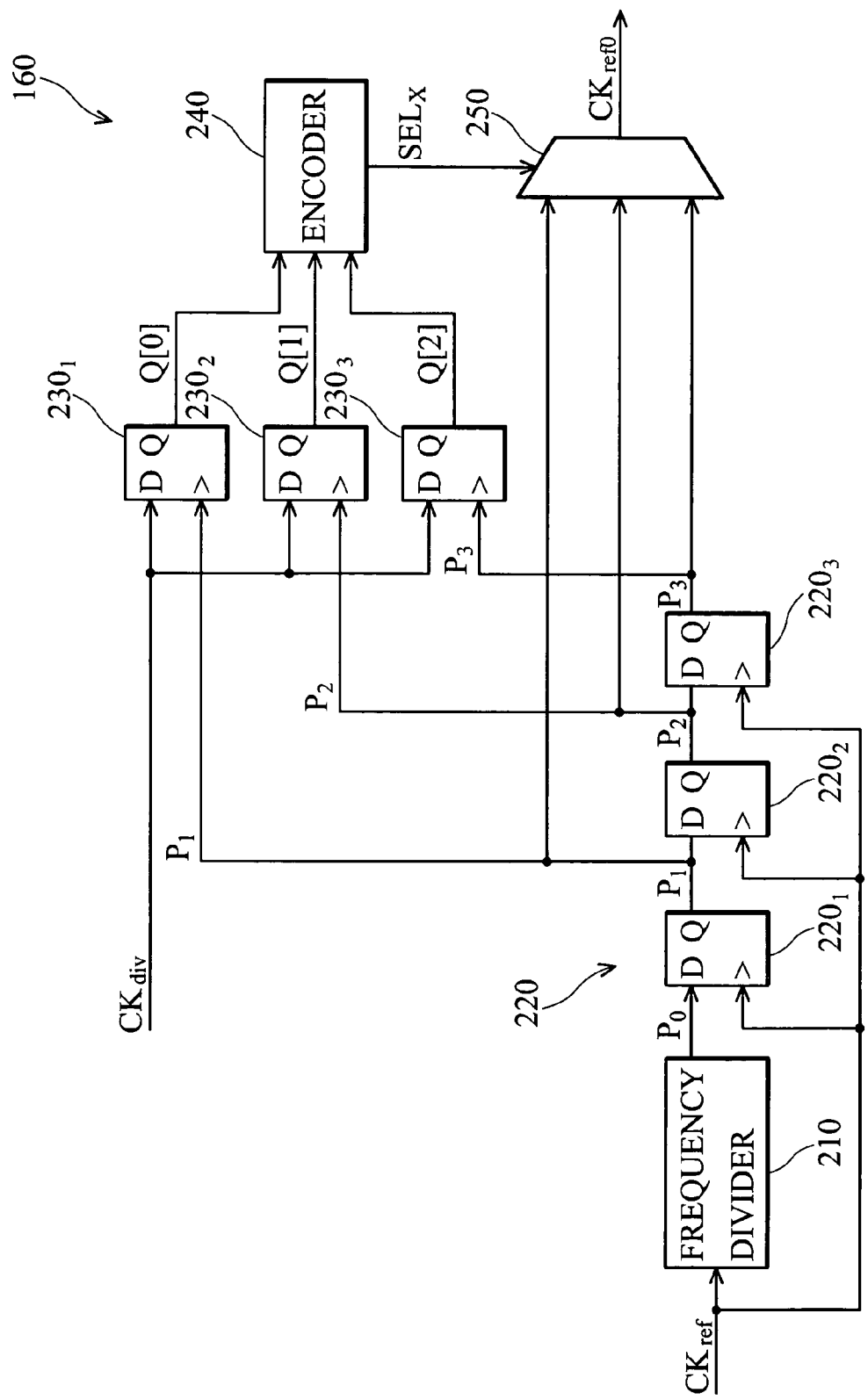
FIG. 2 is a block diagram illustrating an embodiment of a phase-shifted signal generator.
Figure 3:
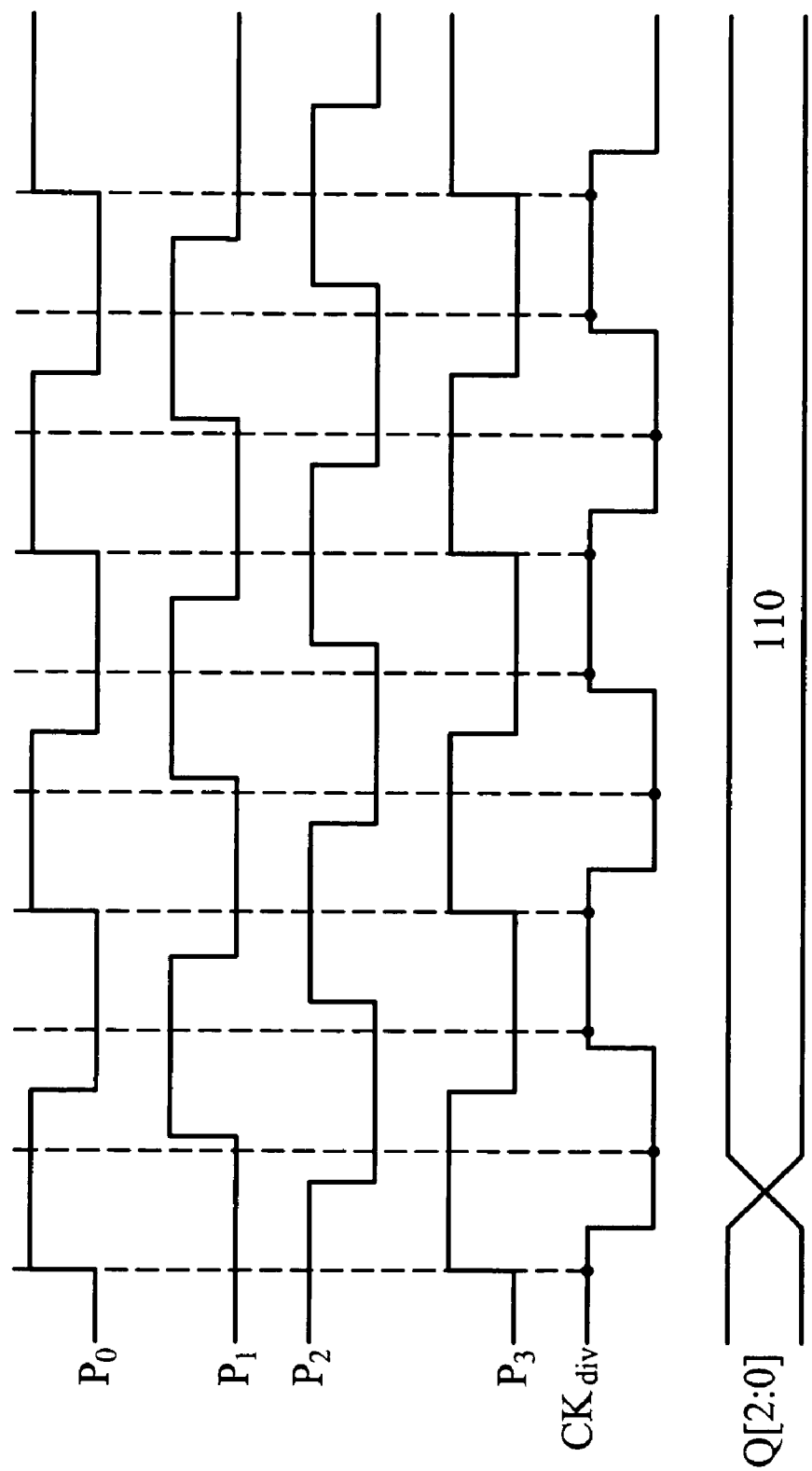
FIG. 3 is an exemplary timing diagram of the phase-shifted signal generator of FIG. 2.

FIG. 2 shows a block diagram of an embodiment of the phase-shifted signal generator 160. The phase-shifted signal generator 160 comprises a frequency divider 210, an encoder 240, a multiplexer 250, and a plurality of D-type flip-flops $220_1$–$230_M$. The reference signal $CK_{ref}$, is received by the frequency divider 210 where the frequency of the $CK_{ref}$ signal is divided by M. The output of the frequency divider 210, identified by reference $P_0$ in FIG. 2, is applied to an M-bit of shift register 220. As an example, the M-bit of shift register 220 in FIG. 2 is constituted by three flip-flops $220_1$–$220_3$ if M=3. Each flip-flop of the shift register 220 is clocked by the $CK_{ref}$ signal as shown. Another M number of flip-flops $230_1$–$230_M$ all accept the $CK_{div}$ signal from the prescaler 150 as input. In the same case of M=3, the flip-flops $230_1$–$230_3$ are clocked by the 3-bit output of the shift register, $P_1$–$P_3$, respectively. Each of the phase-shifted signals $P_1$–$P_3$ has the same frequency but is incrementally shifted in phase from others. With the flip-flops $230_1$–$230_3$, the $CK_{div}$ signal is therefore sampled by separate signals of the same frequency but shifted in phase. The encoder 240 receives a 3-bit output Q[2:0] from the flip-flops $230_{1-2303}$, thereby yielding a select signal $SEL_X$ indicative of which output of the shift register 220 has the phase closest to that of the $CK_{div}$ signal. According to the select signal $SEL_X$, the multiplexer 250 selects one of the three phase-shifted signals $P_1$–$P_3$ for use as the $CK_{ref0}$ signal. FIG. 3 is a timing diagram helpful in understanding the phase-shifted signal generator of FIG. 2.

Figure 4:
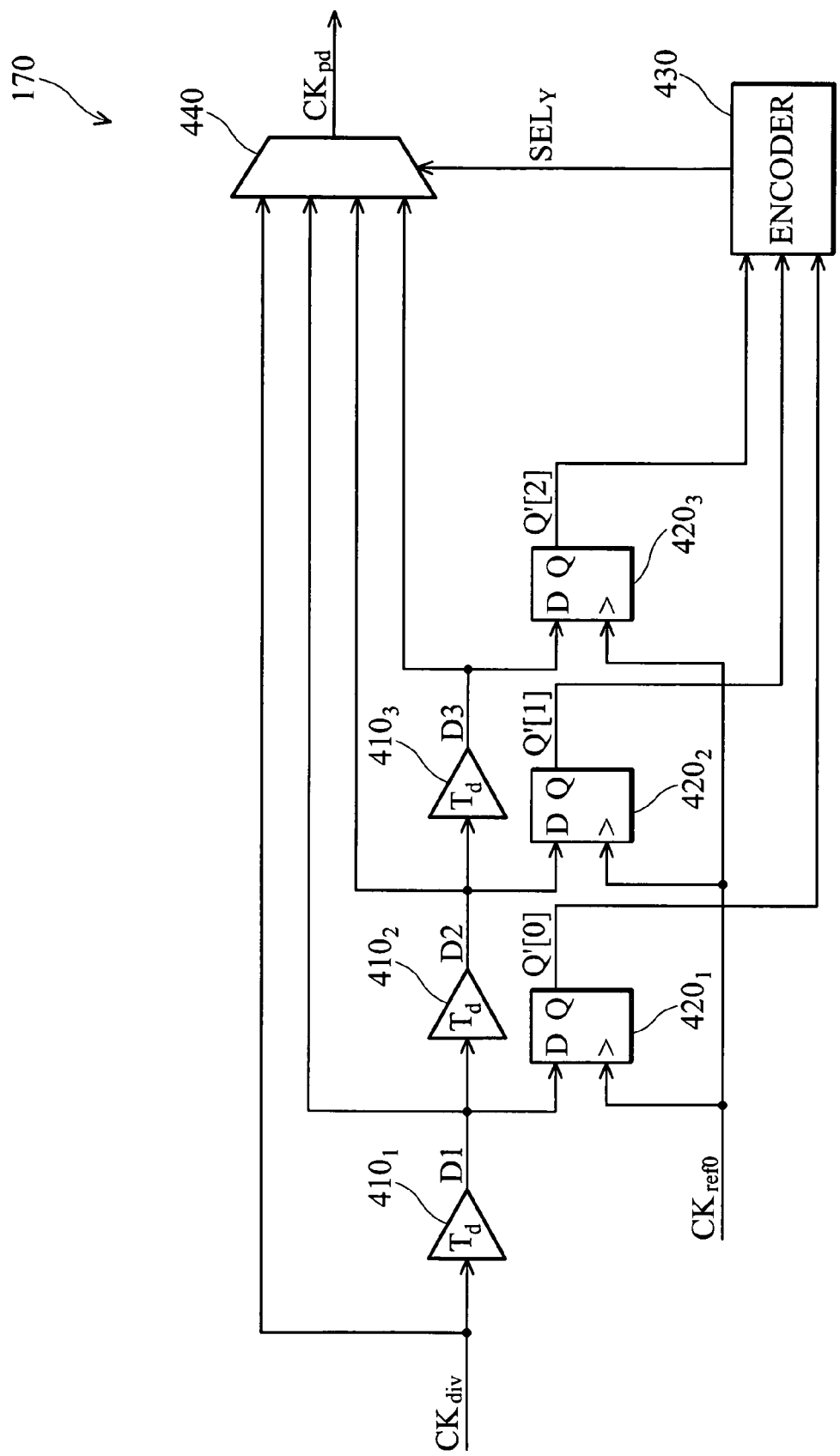
FIG. 4 is a block diagram illustrating an embodiment of a phase delay circuit.
Figure 5:
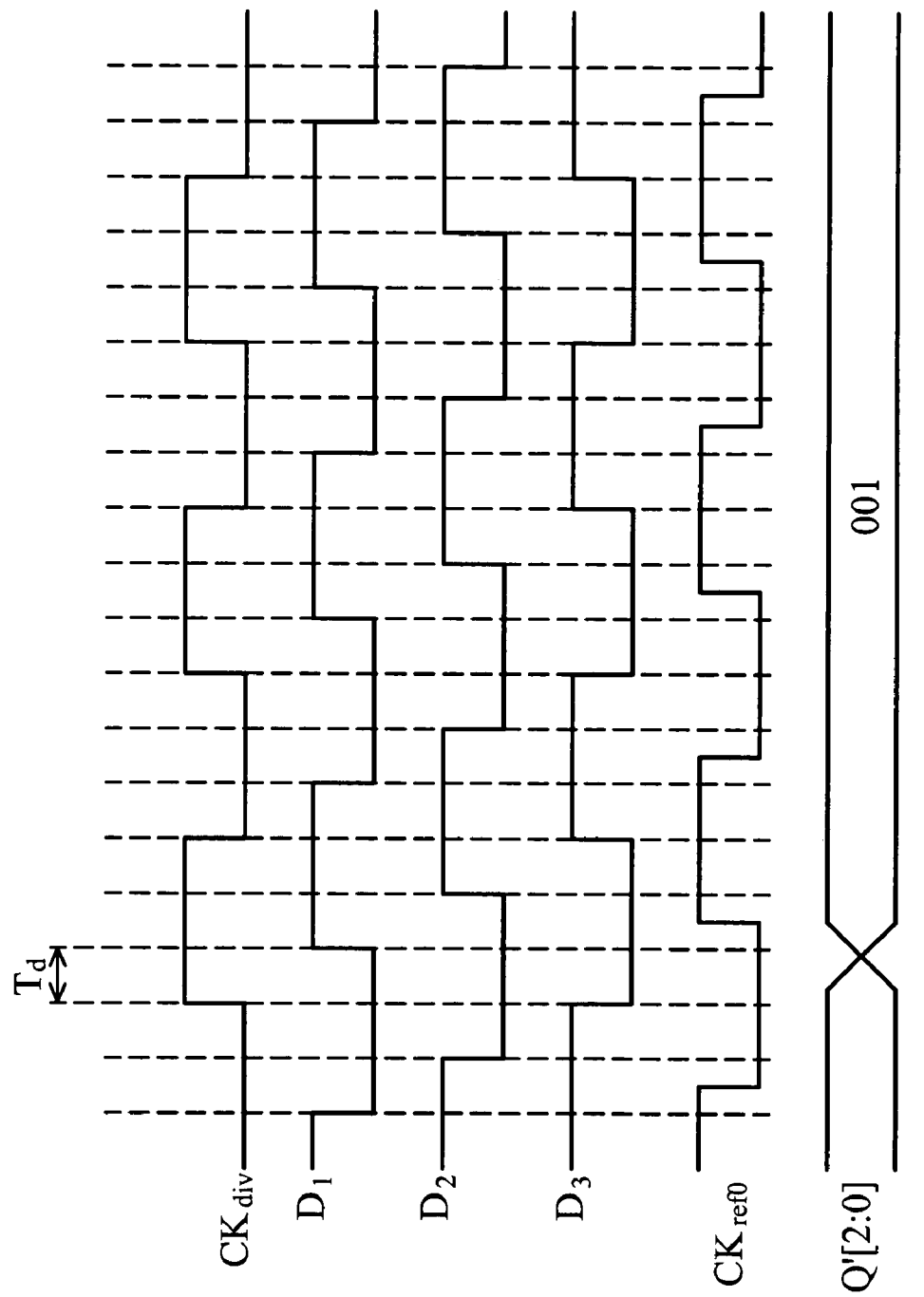
FIG. 5 is an exemplary timing diagram of the phase delay circuit of FIG. 4.

Referring now to FIG. 4, an embodiment of the phase delay circuit 170 is illustrated by way of a block diagram. As depicted, the phase delay circuit 170 comprises an encoder 430, a multiplexer 440, L number of delay elements $410_1$–$410_L$, and L number of D-type flip-flops $420_1$–$420_L$. For the sake of explanation, L is assumed to be 3, as an example. The delay elements $410_1$–$410_3$ with the same delay time $T_d$ are connected in cascade, and the first delay element $410_1$ receives the $CK_{div}$ signal from the prescaler 150. The flip-flops $420_1$–$420_3$ are clocked by the same signal $CK_{ref0}$ from the phase-shifted signal generator 160. $D_1$, $D_2$ and $D_3$, the delayed versions of the $CK_{div}$ signal made by the delay elements $410_1$–$410_3$ are applied to the flip-flops $420_1$–$420_3$ as input, respectively. Then, the encoder 430 receives a 3-bit output Q'[2:0] from the flip-flops $420_1$–$420_3$, thereby yielding a select signal $SEL_Y$ indicative of which of the delayed versions $D_1$–$D_3$ and the original signal $CK_{div}$ has the phase closest to that of the $CK_{ref0}$ signal. Furthermore, the original and delayed versions of $CK_{div}$ are fed to the multiplexer 440 as input. The multiplexer 440 selects one out of its input sources contingent upon the select signal $SEL_Y$, thus creating the $CK_{pd}$ signal. FIG. 5 is a timing diagram helpful in understanding the phase delay circuit of FIG. 4. In this manner, the phases of the signals input to the phase/frequency detector 110 are coarsely tuned close to each other.

Figure 6:
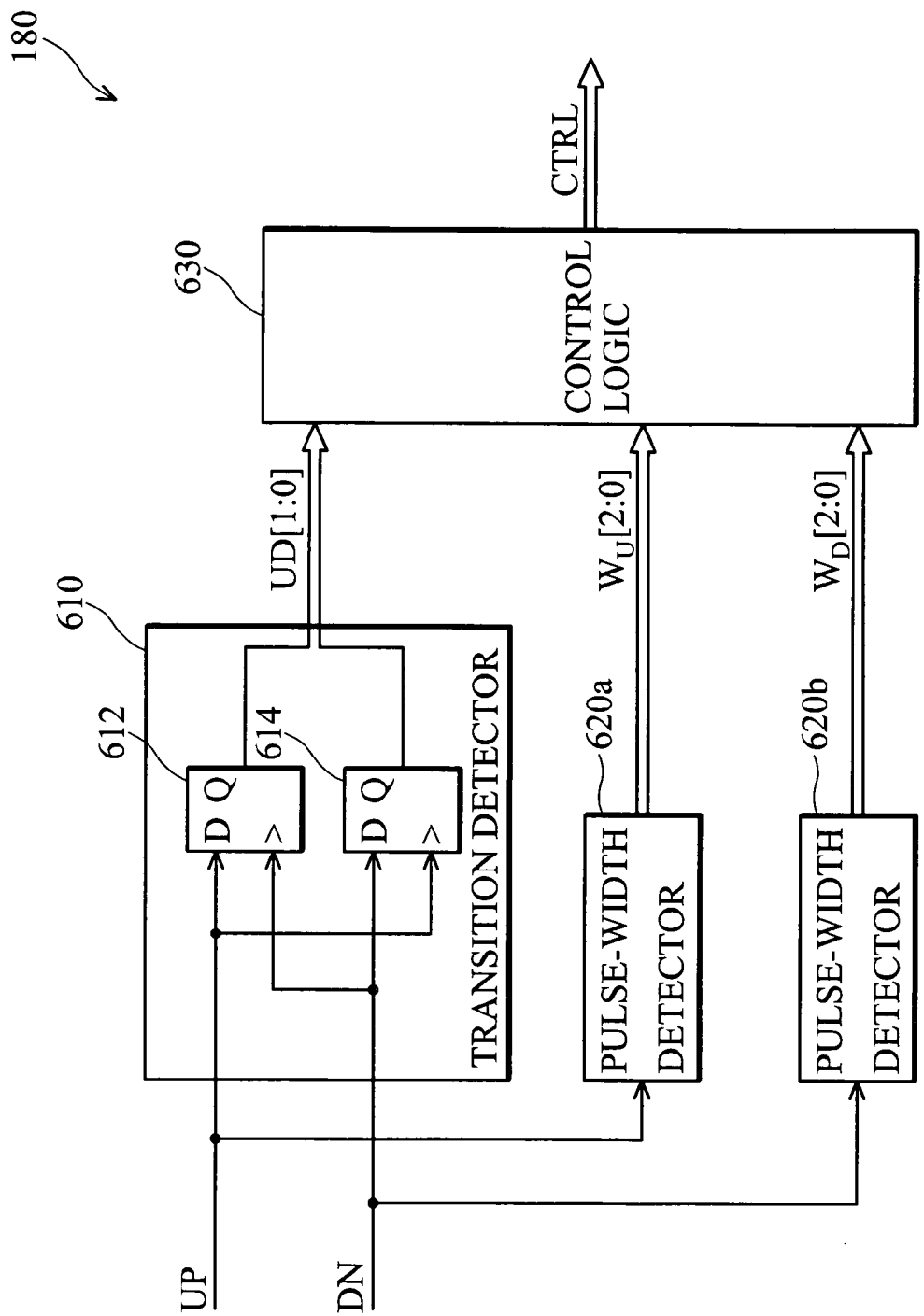
FIG. 6 is a block diagram illustrating an embodiment of a phase discriminator.

Referring to FIG. 6, an embodiment of the phase discriminator 180 is illustrated by way of a block diagram. As can be seen, the phase discriminator 180 comprises a transition detector 610 and two pulse-width detectors 620a and 620b. During the fast-locking mode, the phase discriminator 180 is activated such that the transition detector 610 receives the UP and DN signals from the phase/frequency detector 110. In the embodiment, the UP signal goes high first to indicate that the phase of the $CK_{ref0}$ signal leads that of the $CK_{pd}$ signal while the DN signal goes high first to indicate that the phase of the $CK_{ref0}$ signal lags that of the $CK_{pd}$ signal. As depicted in FIG. 6, an embodiment of the transition detector 610 comprises two D-type flip-flops 612 and 614 to detect which of the UP and DN signals has significant transitions (rising or falling edges) ahead of the other. "Significant transition" herein means either a "rising" or a "falling" edge. The flip-flop 612 receives the UP signal and is clocked by the DN signal; in contrast, the flip-flop 614 receives the DN signal and is clocked by the UP signal. The transition detector 610 thus generates a 2-bit state signal UD[1:0] in which the state signal is indicative whether the significant transitions of the UP signal lead the significant transitions of the DN signal. The UP and DN signals are also applied to the pulse-width detectors 620a and 620b, respectively. In response to the UP signal, the pulse-width detector 620a can generate a width signal indicative of into which range the width of the UP signal falls. The ranges of width are predefined in terms of time and, for example, are not scaled uniformly to offer different resolution in detection of the phase difference. Similarly, in response to the DN signal, the pulse-width detector 620b can generate another width signal indicative of into which range the width of the DN signal falls. As an example, the predefined ranges of width are four segments in time: $0<W \leq W_1$, $W_1<W \leq W_2$, $W_2<W \leq W_3$, and $W_3<W$. Therefore, the width signals $W_U$ and $W_D$ use 3 bits so as to represent any one of the four ranges. Although the same set of predefined ranges is employed to detect the width of signals by the pulse-width detectors 620a and 620b, it should be understood that different sets of predefined ranges are contemplated in implementation of the pulse-width detectors 620a and 620b.

Figure 7A:
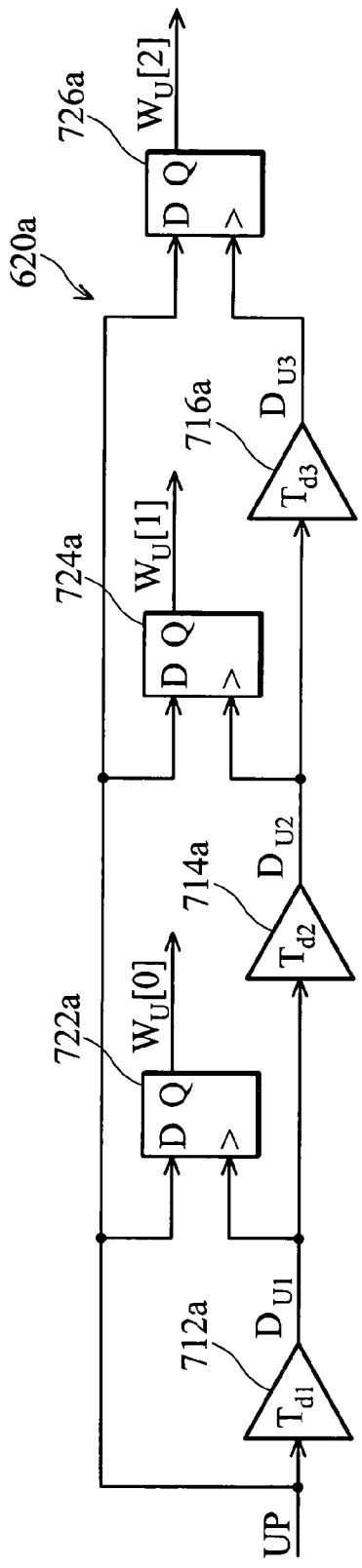
FIG. 7A is a block diagrams illustrating an embodiment of a pulse-width detector.
Figure 7B:
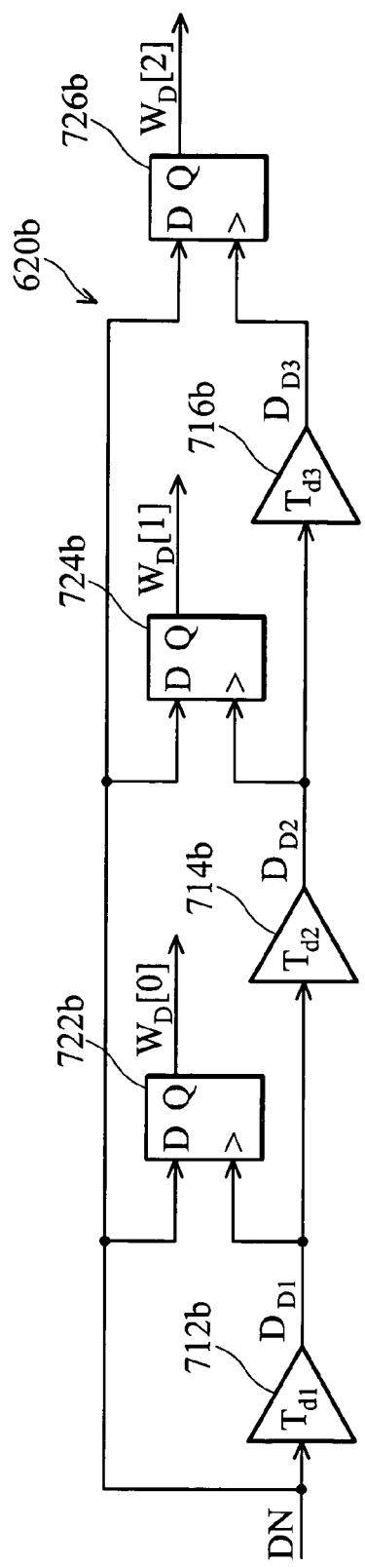
FIG. 7B is a block diagrams illustrating an embodiment of a second pulse-width detector.
Figure 8:
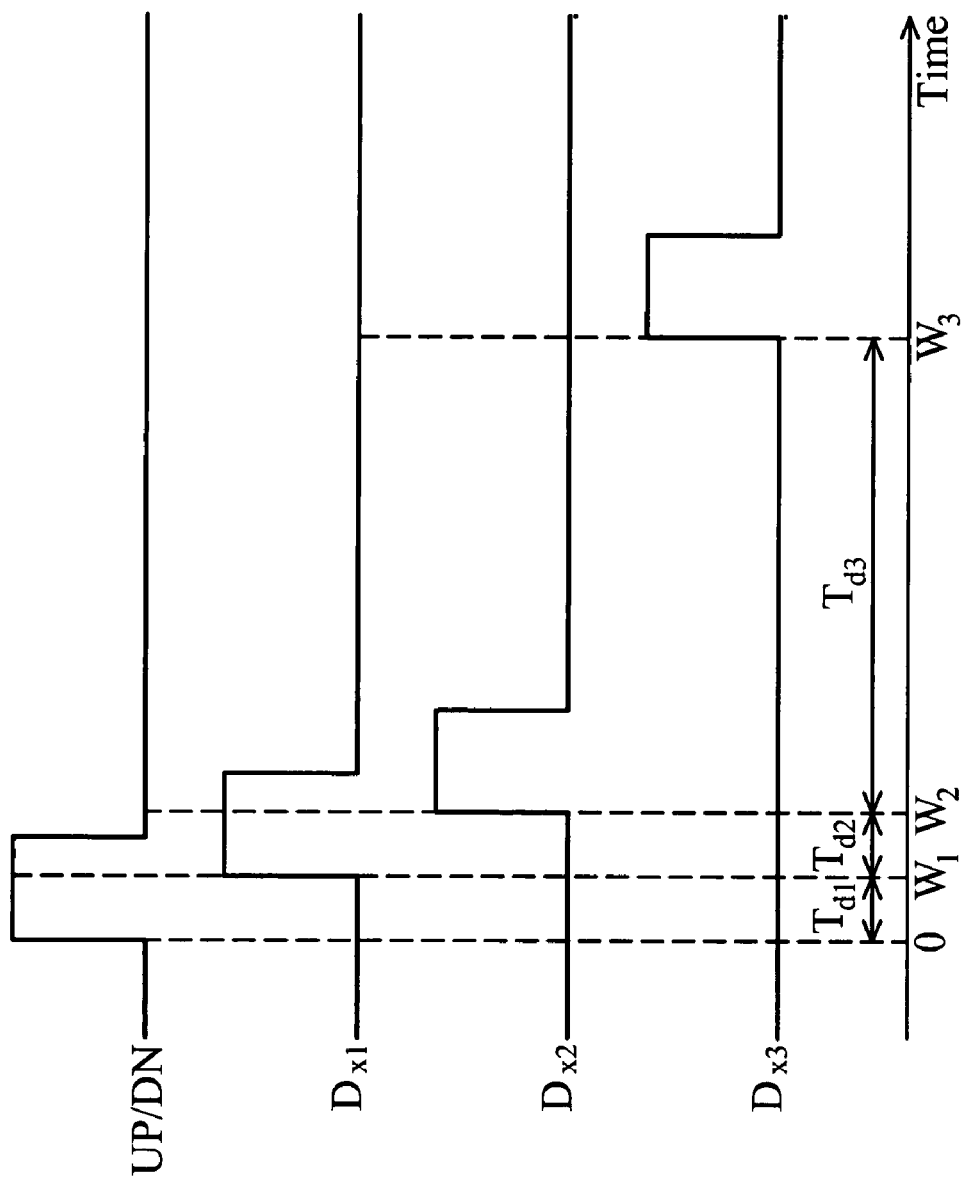
FIG. 8 is an exemplary timing diagram of a pulse-width detector.

The pulse-width detectors 620a and 620b are now described in detail by way of FIGS. 7A and 7B in conjunction with FIG. 8. Assuming that the number of the predefined ranges is 4, the pulse-width detectors 620a comprises three delay elements 712a–716a and three D-type flip-flops 722a–726a as shown in FIG. 7A. The three delay elements 712a–716a are connected in cascade, the first of which receives the UP signal from the phase/frequency detector 110. In this manner, the delay elements 712a–716a generate three delayed versions of the UP signal, $D_{U1}$, $D_{U2}$, and $D_{U3}$. Specifically, the delay element 712a contributes a delay time of $T_{d1}$ to the UP signal, the delay element 714a contributes another delay time of $T_{d2}$ to the UP signal, and the delay element 716a contributes yet another delay time of $T_{d3}$ to the UP signal. The delay elements may create several delays not all the same length in time, thus determining the ranges of pulse width. In this regard, $W_1$ is dictated by $T_{d1}$, $W_2$ is dictated by $T_{d1}+T_{d2}$, and $W_3$ is dictated by $T_{d1}+T_{d2}+T_{d3}$ for the four ranges of width mentioned earlier. The flip-flops 722a–726a are clocked by the three delayed versions of the UP signal, respectively. Each of the flip-flops 722a–726a also accepts the UP signal as input such that the three flip-flops 722a–726a generate the 3-bit width signal $W_U[2:0]$ to indicate which predefined width range covers the width of the UP signal. Turning to FIG. 7B, the pulse-width detector 620b exhibits a structure similar to the pulse-width detectors 620a. Three delay elements 712b–716b are connected in cascade, the first of which receives the DN signal from the phase/frequency detector 110. Hence, the delay elements 712b–716b generate three delayed versions of the DN signal, $D_{D1}$, $D_{D2}$, and $D_{D3}$. Flip-flops 722b–726b are clocked by the three delayed versions of the DN signal, respectively. Each of the flip-flops 722b–726b also accepts the DN signal as input such that the three flip-flops 722b–726b generate the 3-bit width signal $W_D[2:0]$ to indicate which predefined width range covers the width of the DN signal. FIG. 8 is an exemplary timing diagram helpful in understanding the pulse-width detector 620a and 620b, where subscript X denotes either "U" or "D". In the example shown in FIG. 8, an UP pulse with a width of W results in the width signal $W_U[2:0]$="001" when state signal UD[1:0]="01" for example. UD[1:0]="01" indicates that the rising edge of the UP pulse leads the rising edge of the DN pulse. Additionally, $W_U[2:0]$="001" means that the width of the UP pulse falls into the second predefined range, i.e. $W_1<W \leq W_2$.

Referring again to FIG. 6, the phase discriminator 180 also comprises control logic 630 to generate the regulation signal CTRL according to the state signal UD[1:0] and the width signals $W_U[2:0]$ and $W_D[2:0]$. In the fast locking mode, the control logic 630 instructs the variable voltage generator 190 via the regulation signal CTRL to raise or lower the voltage $V_{TUNE}$ by an appropriate $\Delta V$, which, in turn, causes the VCO 140 to increase or decrease the frequency of the $CK_{out}$ signal. In TABLE 1 below, example behavior for the control logic 630 is described in more detail for control of the variable voltage generator 190.

TABLE 1

| INPUT | ACTION |
| --- | --- |
| UD[1:0] = "01", $W_U[2:0]$ = "1xx" | Instruct the variable voltage generator 190 to increase $V_{TUNE}$ by $\Delta V_1$. |
| UD[1:0] = "01", $W_U[2:0]$ = "01x" | Instruct the variable voltage generator 190 to increase $V_{TUNE}$ by $\Delta V_2$. |
| UD[1:0] = "01", $W_U[2:0]$ = "001" | Instruct the variable voltage generator 190 to increase $V_{TUNE}$ by $\Delta V_3$. |
| UD[1:0] = "10", $W_D[2:0]$ = "1xx" | Instruct the variable voltage generator 190 to decrease $V_{TUNE}$ by $\Delta V_1$. |
| UD[1:0] = "10", $W_D[2:0]$ = "01x" | Instruct the variable voltage generator 190 to decrease $V_{TUNE}$ by $\Delta V_2$. |
| UD[1:0] = "10", $W_D[2:0]$ = "001" | Instruct the variable voltage generator 190 to decrease $V_{TUNE}$ by $\Delta V_3$. |
| $W_U[2:0]$ = "000", $W_U[2:0]$ = "000" | Instruct the variable voltage generator 190 to hold $V_{TUNE}$. |

Note:
1. $\Delta V_1 > \Delta V_2 > \Delta V_3$
2. "x" is referred to as a don't care state.

In light of TABLE 1, the regulation signal CTRL causes the variable voltage generator 190 to adjust $V_{TUNE}$ by a greater $\Delta V$ when the width signal $W_U$ or $W_D$ indicates that the phase difference between $CK_{ref0}$ and $CK_{pd}$ is large. In this way, the phase difference can quickly approach zero. The frequency synthesizer 100 of FIG. 1 stays in the fast-locking mode until $W_U[2:0]$ and $W_D[2:0]$ are both equal to "000". As such, the phase difference between $CK_{ref0}$ and $CK_{pd}$ becomes small enough so that the frequency synthesizer 100 enters a normal operating mode.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fast-locking apparatus for frequency synthesis, comprising:
    a transition detector receiving a first pulse signal indicative that the phase of an input signal leads the phase of a reference signal, receiving a second pulse signal indicative that the phase of the input signal lags the phase of the reference signal, and generating a state signal indicative of whether a significant transition of the first pulse signal leads a significant transition of the second pulse signal;

a first pulse-width detector, responsive to the first pulse signal, generating a first width signal indicative of into which of a plurality of first predefined width ranges the width of the first pulse signal falls;

a second pulse-width detector, responsive to the second pulse signal, generating a second width signal indicative of into which of a plurality of second predefined width ranges the width of the second pulse signal falls; and control logic generating a regulation signal used in adjusting the frequency of the input signal according to the state signal and the first and the second width signals.

2. The apparatus of claim 1 wherein the transition detector and the first and the second pulse-width detectors are operatively coupled to a phase/frequency detector to receive the first and the second pulse signals.

3. The apparatus of claim 1 wherein the control logic is operatively coupled to a variable voltage generator that provides a plurality of voltage control signals and selects one voltage control signal as output according to the regulation signal.

4. The apparatus of claim 3 wherein the variable voltage generator is selectively coupled to a voltage-controlled oscillator during a fast-locking mode, and further wherein the voltage-controlled oscillator varies the frequency of the input signal according to the output of the voltage generator during the fast-locking mode.

5. The apparatus of claim 4 wherein the control logic is operatively coupled to a variable-controlled oscillator, and further wherein the voltage-controlled oscillator varies the frequency of the input signal according to the regulation signal.

6. The apparatus of claim 1 wherein the first pulse-width detector comprises:

a plurality of delay elements the first of which receives the first pulse signal such that the plurality of delay elements generates a plurality of delayed versions of the first pulse signal; and a plurality of flip-flops in communication with the plurality of delayed elements and clocked by the plurality of delayed versions of the first pulse signal, respectively, each flip-flop receiving the first pulse signal such that the plurality of flip-flops generates the first width signal to indicate which predefined width range covers the width of the first pulse signal.

7. The apparatus of claim 6 wherein the plurality of delay elements creates a plurality of delays not all the same length, thus determining the plurality of first predefined width ranges.

8. The apparatus of claim 1 wherein the second pulse-width detector comprises:

a plurality of delay elements the first of which receives the second pulse signal such that the plurality of delay elements generates a plurality of delayed versions of the second pulse signal; and a plurality of flip-flops in communication with the plurality of delayed elements and clocked by the plurality of delayed versions of the second pulse signal, respectively, each flip-flop receiving the second pulse signal such that the plurality of flip-flops generates the second width signal to indicate which predefined width range covers the width of the second pulse signal.

9. The apparatus of claim 8 wherein the plurality of delay elements creates a plurality of delays not all the same length, thus determining the plurality of second predefined width ranges.

10. A frequency synthesizer comprising:

a phase-shifted signal generator, responsive to a reference signal, producing a plurality of clock signals incrementally shifted in phase and selecting a reference clock signal from the plurality of clock signals contingent upon the phase of an input signal;

a phase delay circuit receiving the input signal and the reference clock signal, and generating a phase-delayed input signal on the basis of the input signal, in which the phase-delayed input signal has a phase tuned close to the phase of the reference clock signal; and a phase discriminator comprising:

a transition detector receiving a first pulse signal indicative that the phase of the phase-delayed input signal leads the phase of the reference clock signal, receiving a second pulse signal indicative that the phase of the phase-delayed input signal lags the phase of the reference clock signal, and generating a state signal indicative of whether a significant transition of the first pulse signal leads a significant transition of the second pulse signal;

a first pulse-width detector, responsive to the first pulse signal, generating a first width signal indicative of into which of a plurality of first predefined width ranges the width of the first pulse signal falls;

a second pulse-width detector, responsive to the second pulse signal, generating a second width signal indicative of into which of a plurality of second predefined width ranges the width of the second pulse signal falls; and control logic generating a regulation signal used in adjusting the frequency of the input signal according to the state signal and the first and the second width signals.

11. The frequency synthesizer of claim 10 wherein the phase discriminator is operatively coupled to a phase/frequency detector to receive the first and the second pulse signals.

12. The frequency synthesizer of claim 10 wherein the phase discriminator is operatively coupled to a variable voltage generator that provides a plurality of voltage control signals and selects one voltage control signal as output according to the regulation signal.

13. The frequency synthesizer of claim 12 wherein the variable voltage generator is selectively coupled to a voltage-controlled oscillator during a fast-locking mode, and further wherein the voltage-controlled oscillator varies the frequency of the input signal according to the output of the voltage generator during the fast-locking mode.

14. The frequency synthesizer of claim 13 wherein the control logic is operatively coupled to a variable-controlled oscillator, and further wherein the voltage-controlled oscillator varies the frequency of the input signal according to the regulation signal.

15. The frequency synthesizer of claim 10 wherein the first pulse-width detector comprises:

a plurality of delay elements the first of which receives the first pulse signal such that the plurality of delay elements generates a plurality of delayed versions of the first pulse signal; and a plurality of flip-flops in communication with the plurality of delayed elements and clocked by the plurality of delayed versions of the first pulse signal, respectively, each flip-flop receiving the first pulse signal such that the plurality of flip-flops generates the first width signal to indicate which predefined width range covers the width of the first pulse signal.

16. The frequency synthesizer of claim 15 wherein the plurality of delay elements creates a plurality of delays not all the same length, thus determining the plurality of first predefined width ranges.

17. The frequency synthesizer of claim 10 wherein the second pulse-width detector comprises:
   a plurality of delay elements the first of which receives the second pulse signal such that the plurality of delay elements generates a plurality of delayed versions of the second pulse signal; and
   a plurality of flip-flops in communication with the plurality of delayed elements and clocked by the plurality of delayed versions of the second pulse signal, respectively, each flip-flop receiving the second pulse signal such that the plurality of flip-flops generates the second width signal to indicate which predefined width range covers the width of the second pulse signal.

18. The frequency synthesizer of claim 17 wherein the plurality of delay elements creates a plurality of delays not all the same length, thus determining the plurality of first predefined width ranges.

19. A fast-locking method for frequency synthesis, comprising:
   receiving a first pulse signal indicative that the phase of a phase-delayed input signal leads the phase of a reference clock signal;
   receiving a second pulse signal indicative that the phase of the phase-delayed input signal lags the phase of the reference clock signal;
   generating a state signal indicative of whether a significant transition of the first pulse signal leads a significant transition of the second pulse signal;
   generating a first width signal indicative of into which of a plurality of first predefined width ranges the width of the first pulse signal falls;
   generating a second width signal indicative of into which of a plurality of second predefined width ranges the width of the second pulse signal falls; and
   according to the state signal and the first and the second width signals, generating a regulation signal used in adjusting the frequency of the phase-delayed input signal.

20. The method of claim 19 further comprising:
   receiving a reference signal and an input signal;
   in response to a reference signal, producing a plurality of clock signals incrementally shifted in phase;
   selecting the reference clock signal from the plurality of clock signals contingent upon the phase of the input signal; and
   generating the phase-delayed input signal on the basis of the input signal, in which the phase-delayed input signal has a phase tuned close to the phase of the reference clock signal.

* * * * *